(12) United States Patent
Kennedy

(10) Patent No.: US 12,339,324 B2
(45) Date of Patent: Jun. 24, 2025

(54) DETERMINING STATE OF CHARGE FOR BATTERY POWERED DEVICES INCLUDING BATTERY POWERED SURFACE TREATMENT APPARATUSES

(71) Applicant: SHARKNINJA OPERATING LLC, Needham, MA (US)

(72) Inventor: Kevin Kennedy, Quincy, MA (US)

(73) Assignee: SharkNinja Operating LLC, Needham, MA (US)

( * ) Notice: Subject to any disclaimer, the term of this patent is extended or adjusted under 35 U.S.C. 154(b) by 208 days.

(21) Appl. No.: 17/726,631

(22) Filed: Apr. 22, 2022

(65) Prior Publication Data

US 2022/0342001 A1    Oct. 27, 2022

Related U.S. Application Data

(60) Provisional application No. 63/178,924, filed on Apr. 23, 2021.

(51) Int. Cl.
| | | |
|---|---|---|
| G01R 31/3842 | (2019.01) |
| A47L 9/28 | (2006.01) |
| G01R 31/389 | (2019.01) |
| H01M 10/42 | (2006.01) |

(52) U.S. Cl.
CPC ........ *G01R 31/3842* (2019.01); *A47L 9/2884* (2013.01); *H01M 10/4207* (2013.01); *G01R 31/389* (2019.01); *H01M 2220/30* (2013.01)

(58) Field of Classification Search
CPC .............. G01R 31/3842; G01R 31/389; G01R 31/387; A47L 9/2884; A47L 9/2857; H01M 10/4207; H01M 2220/30; H01M 10/425; H01M 10/488; H01M 2010/4278; H01M 10/482
See application file for complete search history.

(56) References Cited

U.S. PATENT DOCUMENTS

| | | |
|---|---|---|
| 4,745,654 A | 5/1988 | Yamamoto et al. |
| 5,014,388 A | 5/1991 | Schiazza et al. |
| 5,589,288 A | 12/1996 | Coulson et al. |
| 5,771,448 A | 6/1998 | Cooper |
| 5,829,090 A | 11/1998 | Melito et al. |
| 6,360,399 B1 | 3/2002 | Vandenbelt et al. |

(Continued)

FOREIGN PATENT DOCUMENTS

| | | |
|---|---|---|
| EP | 0401531 A2 | 12/1990 |
| EP | 1075906 A2 | 2/2001 |

(Continued)

OTHER PUBLICATIONS

PCT Search Report and Written Opinion mailed Aug. 1, 2022, received in corresponding PCT Application No. PCT/US22/25863, 11 pages.

(Continued)

*Primary Examiner* — Mohammad K Islam
(74) *Attorney, Agent, or Firm* — Grossman Tucker Perreault & Pfleger, PLLC

(57) ABSTRACT

A surface treatment apparatus may include a power source having one or more batteries and an apparatus controller configured to estimate a state of charge of the one or more batteries based, at least in part, on an operational mode of the surface treatment apparatus.

12 Claims, 3 Drawing Sheets

(56) References Cited

U.S. PATENT DOCUMENTS

| | | |
|---|---|---|
| 6,456,035 B1 | 9/2002 | Crisp et al. |
| 6,457,205 B1 | 10/2002 | Conrad |
| 7,091,697 B2 | 8/2006 | Mader et al. |
| 7,137,169 B2 | 11/2006 | Murphy et al. |
| 7,356,873 B2 | 4/2008 | Nielsen |
| 7,665,180 B2 | 2/2010 | Haan |
| 9,504,364 B2 | 11/2016 | Reed et al. |
| 10,568,481 B2 | 2/2020 | Reed et al. |
| 10,870,360 B2* | 12/2020 | Campbell ............... H04Q 9/00 |
| 11,458,771 B2* | 10/2022 | Thorne ..................... B60C 7/14 |
| 11,484,169 B2* | 11/2022 | Howard ............... A47L 9/1409 |
| 11,497,366 B2* | 11/2022 | Xu ........................ A47L 9/1683 |
| 11,998,150 B2* | 6/2024 | Innes ......................... A47L 9/12 |
| 2003/0201754 A1 | 10/2003 | Conrad |
| 2004/0134026 A1 | 7/2004 | Brinkhoff et al. |
| 2005/0007068 A1 | 1/2005 | Johnson et al. |
| 2005/0015918 A1 | 1/2005 | Rukavina et al. |
| 2005/0055795 A1* | 3/2005 | Zeiler .................. A47L 7/0085 |
| | | 15/353 |
| 2005/0155177 A1 | 7/2005 | Baer et al. |
| 2006/0137133 A1 | 6/2006 | Yik et al. |
| 2006/0164032 A1 | 7/2006 | Johnson et al. |
| 2007/0226946 A1 | 10/2007 | Best |
| 2008/0040883 A1 | 2/2008 | Beskow et al. |
| 2008/0047092 A1 | 2/2008 | Schnittman et al. |
| 2008/0134460 A1 | 6/2008 | Conrad |
| 2008/0148512 A1 | 6/2008 | Beskow et al. |
| 2012/0260944 A1* | 10/2012 | Martins, Jr. ........... A47L 9/2826 |
| | | 15/340.1 |
| 2013/0058635 A1 | 3/2013 | Vrdoljak |
| 2013/0152337 A1 | 6/2013 | Thorne |
| 2014/0150201 A1 | 6/2014 | McGee |
| 2014/0366286 A1* | 12/2014 | Zheng ................. A47L 11/4008 |
| | | 15/3 |
| 2015/0013102 A1 | 1/2015 | Bilger |
| 2015/0040340 A1 | 2/2015 | Bilger et al. |
| 2015/0135474 A1 | 5/2015 | Gidwell |
| 2015/0297054 A1 | 10/2015 | Weeks et al. |
| 2015/0351596 A1 | 12/2015 | Thorne |
| 2016/0128530 A1 | 5/2016 | Thorne et al. |
| 2016/0174793 A1 | 6/2016 | Burke et al. |
| 2016/0220080 A1 | 8/2016 | Thorne |
| 2016/0220081 A1 | 8/2016 | Xu et al. |
| 2016/0220082 A1 | 8/2016 | Thorne et al. |
| 2016/0324388 A1 | 11/2016 | Vrdoljak et al. |
| 2016/0374533 A1 | 12/2016 | Innes et al. |
| 2017/0042319 A1 | 2/2017 | Conrad et al. |
| 2017/0112343 A1 | 4/2017 | Innes et al. |
| 2017/0127896 A1 | 5/2017 | Carter et al. |
| 2017/0135541 A1* | 5/2017 | Kwak ................... A47L 9/2857 |
| 2017/0144562 A1* | 5/2017 | Thomas ............ H01M 10/4257 |
| 2017/0144810 A1 | 5/2017 | Birdsell |
| 2017/0215667 A1 | 8/2017 | Thorne et al. |
| 2017/0245711 A1 | 8/2017 | Son et al. |
| 2017/0347848 A1 | 12/2017 | Carter et al. |
| 2018/0035854 A1 | 2/2018 | Thorne |
| 2018/0064301 A1 | 3/2018 | Cottrell et al. |
| 2018/0068815 A1 | 3/2018 | Cottrell |
| 2018/0070785 A1 | 3/2018 | Udy et al. |
| 2018/0210452 A1 | 7/2018 | Shin et al. |
| 2018/0255991 A1 | 9/2018 | Der Marderosian et al. |
| 2018/0296046 A1 | 10/2018 | Thorne et al. |
| 2018/0306432 A1 | 10/2018 | Ognjen et al. |
| 2018/0325252 A1 | 11/2018 | Hopke et al. |
| 2018/0338654 A1 | 11/2018 | Kelsey |
| 2018/0338656 A1 | 11/2018 | Carter et al. |
| 2019/0038098 A1 | 2/2019 | Thorne et al. |
| 2019/0059668 A1 | 2/2019 | Thorne et al. |
| 2019/0069740 A1 | 3/2019 | Thorne et al. |
| 2019/0069744 A1 | 3/2019 | Liggett et al. |
| 2019/0090701 A1 | 3/2019 | Tonderys et al. |
| 2019/0090705 A1 | 3/2019 | Thorne et al. |
| 2019/0191947 A1 | 6/2019 | Freese et al. |
| 2019/0193120 A1 | 6/2019 | Brown et al. |
| 2019/0246853 A1 | 8/2019 | Sardar et al. |
| 2019/0274500 A1 | 9/2019 | Thorne et al. |
| 2019/0274501 A1 | 9/2019 | Antonisami et al. |
| 2019/0302793 A1 | 10/2019 | Leech et al. |
| 2019/0320865 A1 | 10/2019 | Brown et al. |
| 2019/0320866 A1 | 10/2019 | Thorne et al. |
| 2019/0335968 A1 | 11/2019 | Harting et al. |
| 2019/0343349 A1 | 11/2019 | Clare et al. |
| 2019/0357740 A1 | 11/2019 | Thorne et al. |
| 2020/0000298 A1 | 1/2020 | Brown et al. |
| 2020/0022543 A1 | 1/2020 | Gill et al. |
| 2020/0022544 A1 | 1/2020 | Gill et al. |
| 2020/0022553 A1 | 1/2020 | Gill et al. |
| 2020/0037833 A1 | 2/2020 | Niedzwecki et al. |
| 2020/0037843 A1 | 2/2020 | Fiebig et al. |
| 2020/0046184 A1 | 2/2020 | Freese et al. |
| 2020/0077855 A1 | 3/2020 | Brown et al. |
| 2020/0085267 A1 | 3/2020 | Thorne et al. |
| 2020/0085269 A1 | 3/2020 | Thorne |
| 2020/0093342 A1* | 3/2020 | Jeong .................. A47L 11/4005 |
| 2020/0121144 A1 | 4/2020 | Gacin et al. |
| 2020/0121147 A1 | 4/2020 | Izawa et al. |
| 2020/0121148 A1 | 4/2020 | Hoffman et al. |
| 2020/0138260 A1 | 5/2020 | Sutter et al. |
| 2020/0166949 A1 | 5/2020 | Leech et al. |
| 2020/0170470 A1 | 6/2020 | Liggett et al. |
| 2020/0201348 A1 | 6/2020 | Leech |
| 2020/0205631 A1 | 7/2020 | Brown et al. |
| 2020/0205634 A1 | 7/2020 | Sutter et al. |
| 2020/0237171 A1 | 7/2020 | Xu et al. |
| 2020/0241914 A1 | 7/2020 | Barker et al. |
| 2020/0251914 A1* | 8/2020 | Arnold .................. H02J 7/0044 |
| 2020/0254154 A1* | 8/2020 | Reasoner ............. G05D 1/0088 |
| 2020/0288929 A1 | 9/2020 | Brunner |
| 2020/0288930 A1 | 9/2020 | Wells |
| 2020/0297172 A1 | 9/2020 | Tonderys et al. |
| 2020/0301430 A1 | 9/2020 | Irkliy et al. |
| 2020/0315418 A1 | 10/2020 | Howard et al. |
| 2020/0345190 A1* | 11/2020 | Buehler ................ A47L 9/2847 |
| 2020/0345196 A1 | 11/2020 | Innes et al. |
| 2020/0367711 A1 | 11/2020 | Thorne et al. |
| 2020/0371526 A1 | 11/2020 | Kamada |
| 2020/0383547 A1 | 12/2020 | Sutter et al. |
| 2021/0007569 A1 | 1/2021 | Howard et al. |
| 2021/0022574 A1 | 1/2021 | Harting |
| 2021/0030227 A1 | 2/2021 | Mathieu et al. |
| 2021/0038032 A1 | 2/2021 | Brown |
| 2021/0059492 A1* | 3/2021 | Taylor .................. A47L 9/0466 |
| 2021/0059495 A1 | 3/2021 | Gill et al. |
| 2021/0085144 A1 | 3/2021 | Woodrow et al. |
| 2021/0169289 A1 | 6/2021 | Thorne et al. |
| 2021/0175772 A1 | 6/2021 | Aini |
| 2021/0177223 A1 | 6/2021 | Der Marderosian et al. |
| 2021/0186282 A1 | 6/2021 | Mathieu et al. |
| 2021/0204684 A1 | 7/2021 | Heman-Ackah et al. |
| 2021/0254615 A1 | 8/2021 | Burbank |
| 2021/0307581 A1 | 10/2021 | Thorne et al. |
| 2021/0315428 A1 | 10/2021 | Udy et al. |
| 2021/0386261 A1 | 12/2021 | Woodrow et al. |
| 2021/0386262 A1 | 12/2021 | Uchendu et al. |
| 2022/0031131 A1 | 2/2022 | McClay et al. |
| 2022/0031133 A1 | 2/2022 | Der Marderosian et al. |
| 2022/0031134 A1 | 2/2022 | Yang et al. |
| 2022/0061614 A1 | 3/2022 | Yu et al. |
| 2022/0071459 A1 | 3/2022 | Gacin et al. |
| 2022/0095864 A1 | 3/2022 | Der Marderosian et al. |
| 2022/0125256 A1 | 4/2022 | Lessard et al. |
| 2022/0187380 A1* | 6/2022 | Bryan .................. G01R 31/382 |
| 2022/0287521 A1 | 9/2022 | Cottrell et al. |
| 2022/0322903 A1 | 10/2022 | Lessard |
| 2022/0400922 A1 | 12/2022 | McClay et al. |
| 2022/0408994 A1 | 12/2022 | Hill |
| 2023/0043567 A1 | 2/2023 | Copeland et al. |
| 2023/0070147 A1 | 3/2023 | Harting et al. |
| 2023/0157495 A1 | 5/2023 | Copeland et al. |
| 2023/0248192 A1 | 8/2023 | Brown et al. |
| 2023/0320550 A1 | 10/2023 | Teuscher et al. |
| 2023/0329502 A1 | 10/2023 | Chirikjian |
| 2023/0355065 A1 | 11/2023 | Finnegan |

(56) References Cited

U.S. PATENT DOCUMENTS

2023/0414052 A1    12/2023   McClay et al.
2024/0008699 A1     1/2024   Innes et al.
2024/0415352 A1    12/2024   McClay et al.

FOREIGN PATENT DOCUMENTS

| EP | 1498999 A2 | 1/2005 | |
|---|---|---|---|
| GB | 2405787 A | 3/2005 | |
| GB | 2420031 A | 5/2006 | |
| JP | 2001321306 A | 11/2001 | |
| JP | 2005052339 A | 3/2005 | |
| JP | 2006095210 A | 4/2006 | |
| JP | 2008206613 A | 9/2008 | |
| WO | 2004032696 | 4/2004 | |
| WO | WO-2004032696 A2 * | 4/2004 | ........... A47L 9/2805 |
| WO | 2006084561 A1 | 8/2006 | |

OTHER PUBLICATIONS

Dahmus et al. "Modular Product Structure" ASME Design Engineering Technical Conferences and Computers and Information in Engineering Conference Sep. 10-13, 2000, 11 pages.
"VersaPak System" Wayback Machine; www.Archive.org., Oct. 30, 1996, (http://blackanddecker.com:80/versapak/index.shtml;) 2 pages.
"Black and Decker Timeline," http://www.blackanddecker100years.com/timeline/ (1994), 1 page.

* cited by examiner

DETERMINING STATE OF CHARGE FOR BATTERY POWERED DEVICES INCLUDING BATTERY POWERED SURFACE TREATMENT APPARATUSES

CROSS-REFERENCE TO RELATED APPLICATIONS

The present application claims the benefit of U.S. Provisional Application Ser. No. 63/178,924, filed on Apr. 23, 2021, entitled Determining State of Charge for Battery Powered Devices including Battery Powered Surface Treatment Apparatuses, which is fully incorporated herein by reference.

TECHNICAL FIELD

The present disclosure generally relates to battery powered devices and more specifically to a state of charge for battery powered surface treatment apparatuses (e.g., vacuum cleaners).

BACKGROUND INFORMATION

Surface treatment apparatuses can be configured to clean one or more surfaces (e.g., a floor). Surface treatment apparatuses may include, for example, a vacuum cleaner, a mop, a powered broom, and/or any other surface treatment apparatus. Surface treatment apparatuses may include one or more powered components (e.g., one or more suction motor(s), light(s), agitator motor(s), and/or any other electrical component). The one or more powered components may be powered by, for example, electrical mains and/or one or more batteries. When one or more batteries are used as a power source for the one or more powered components, the surface treatment apparatus may be configured to display a state of charge of the one or more batteries. The state of charge may be indicative of a remaining time left in which the one or more batteries are capable of providing sufficient electrical energy to power one or more powered components. Accuracy of the state of charge determination may be detrimentally influenced by large current draws generated by one or more powered components (e.g., generated by one or more motors).

BRIEF DESCRIPTION OF THE DRAWINGS

These and other features and advantages will be better understood by reading the following detailed description, taken together with the drawings wherein.

DETAILED DESCRIPTION

The present disclosure is generally directed to a surface treatment apparatus (e.g., a vacuum cleaner). One example of the surface treatment apparatus may include a power source having one or more batteries and a controller. The controller is configured to estimate a state charge of the one or more batteries.

Figure 1:
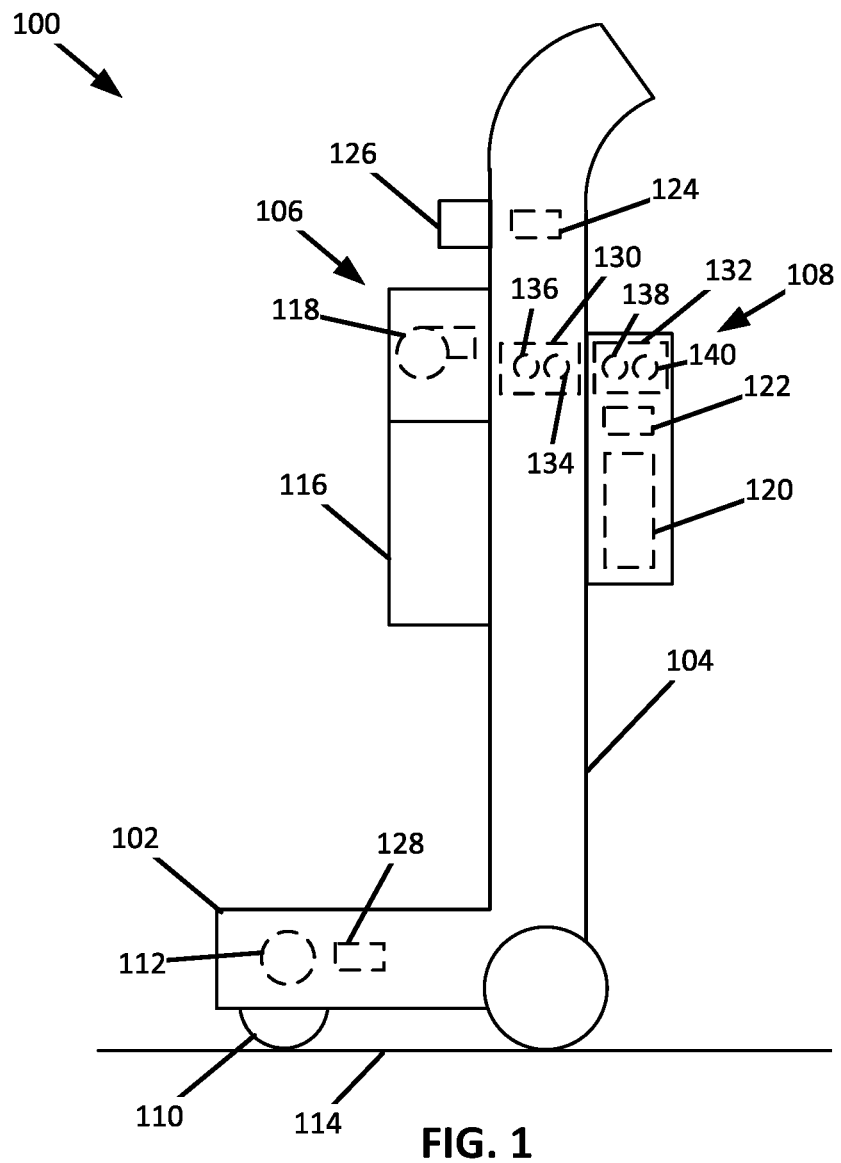
FIG. 1 is a schematic example of a surface treatment apparatus, consistent with embodiments of the present disclosure.

FIG. 1 shows a schematic example of a surface treatment apparatus 100. As shown, the surface treatment apparatus 100 includes a surface cleaning head 102, an upright section 104 moveably coupled to the surface cleaning head 102, a cleaning assembly 106 fluidly coupled to the surface cleaning head 102, and a power source 108 electrically coupled to one or more of the cleaning assembly 106 and/or the surface cleaning head 102. The surface cleaning head 102 includes an agitator 110 (e.g., a brush roll) and an agitator motor 112 configured to cause the agitator 110 to rotate. Rotation of the agitator 110 may cause debris on a surface 114 (e.g., a floor) to be disturbed.

The cleaning assembly 106 includes a dust cup 116 and a suction motor 118. The suction motor 118 is configured to cause air to flow into the surface cleaning head 102 and into the dust cup 116. In other words, the suction motor 118 is fluidly coupled to the dust cup 116 and the surface cleaning head 102. At least a portion of any debris disturbed by the rotation of the agitator 110 may become entrained within air flowing through the surface cleaning head 102. At least a portion of the entrained debris may be deposited into the dust cup 116. As such, the suction motor 118 may generally be described as being fluidly coupled to the dust cup 116 and the surface cleaning head 102.

The power source 108 is electrically coupled to one or more of the suction motor 118 and/or the agitator motor 112. In some instances, the power source 108 may be removably coupled to the upright section 104. The power source 108 may include one or more batteries 120 and a battery controller 122. The battery controller 122 may be configured to monitor one or more battery states (e.g., voltage, current draw, battery temperature, and/or any other battery state). The one or more batteries 120 may include rechargeable lithium ion batteries.

As shown, the surface treatment apparatus 100 may further include an apparatus controller 124, a user interface 126, and one or more motor sensors 128. The user interface 126 may be configured to display information relating to the surface treatment apparatus 100 (e.g., using one or more of light emitting diodes, liquid crystal displays, and/or any other form of displaying information) and/or to receive one or more user inputs (e.g., using one or more toggles or buttons). The one or more motor sensors 128 are each configured to monitor one or more motor states (e.g., current draw, voltage, motor temperature, and/or any other motor state) of a corresponding one or more of the suction motor 118 or the agitator motor 112. For example, the one or more motor sensors 128 may include a current sensor that is configured to measure a current draw of the agitator motor 112.

The apparatus controller 124 may be communicatively coupled (e.g., through a wireless or wired connection) to the battery controller 122, the user interface 126, and/or the one or more motor sensors 128. For example, the battery controller 122 may be configured to communicate one or more battery states (e.g., a state of charge of the one or more batteries 120 of the power source 108) to the apparatus controller 124 and each of the one or more motor sensors 128 may be configured to communicate a respective motor state to the apparatus controller 124. In this example, the apparatus controller 124 may be configured to cause the user interface 126 to display information that is based, at least in part, on the one or more battery states (e.g., display a visual representation corresponding to a state of charge of the one or more batteries 120 of the power supply 108) and/or the one or more motor states.

As shown, the apparatus controller 124 and the battery controller 122 may be communicatively coupled using apparatus communication circuitry 130 and power source communication circuitry 132. The apparatus communication circuitry 130 may be configured to wirelessly communicate with the power source communication circuitry 132. The apparatus communication circuitry 130 may include at least one of an apparatus transmitter 134 and/or an apparatus receiver 136 and the power source communication circuitry 132 may include at least one of a power source transmitter 138 and/or a power source receiver 140. As such, the apparatus communication circuitry 130 and the power source communication circuitry 132 may be configured for unidirectional or bidirectional communication. The transmitters 134 and 138 and the receivers 136 and 140 may be optical (e.g., infrared) transmitters and receivers. As such, the wireless connection may generally be described as being established using at least one infrared receiver and at least one infrared transmitter. Use of optical transmitters 134 and 138 and optical receivers 136 and 140 as opposed to, for example, electrical communication may prevent and/or other mitigate the effects of electrical interference on the communications, may provide galvanic isolation for communications, and may improve communication reliability (e.g., when the power source 108 is removably coupled to the upright section 104).

Alternatively, the battery controller 122 may not be communicatively coupled to the apparatus controller 124. In these instances, the apparatus controller 124 can be configured to estimate a state of charge of the one or more batteries of the power supply 108. For example, a state of charge of the batteries 120 may be estimated based, at least in part, on one or more of a current draw of the agitator motor 112, a measured voltage at the apparatus controller 124, and/or a calculated voltage drop resulting from electrical wiring/components that electrically couple the apparatus controller 124 with the agitator motor 112. The estimated state of charge may also reflect a power draw of other components (e.g., the suction motor 118). In some instances, the estimated state of charge may be based, at least in part, on an operational mode of the surface treatment apparatus 100.

Figure 2:
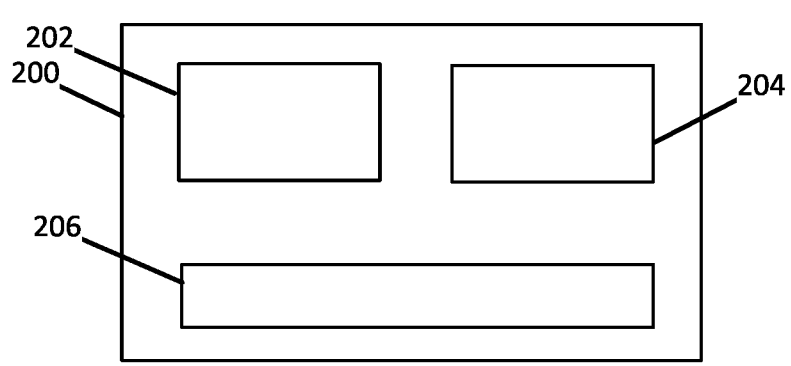
FIG. 2 is a schematic example of a controller, consistent with embodiments of the present disclosure.

FIG. 2 shows a schematic example of a controller 200, which may be an example of the apparatus controller 124 and/or the battery controller 122 of FIG. 1. As shown, the controller 200 includes one or more processors 202 communicatively coupled to one or more memories 204 (e.g., one or more non-transitory memories). At least one of the one or more memories 204 are configured to store one or more instructions configured to be executed on at least one of the one or more processors 202. As also shown, the controller 200 may further include a bus 206 configured to communicatively couple to one or more components of the surface treatment apparatus 100 (e.g., the one or more motor sensors 128, the apparatus communication circuitry 130, the power source communication circuitry 132, the user interface 126, and/or any other component).

Figure 3:
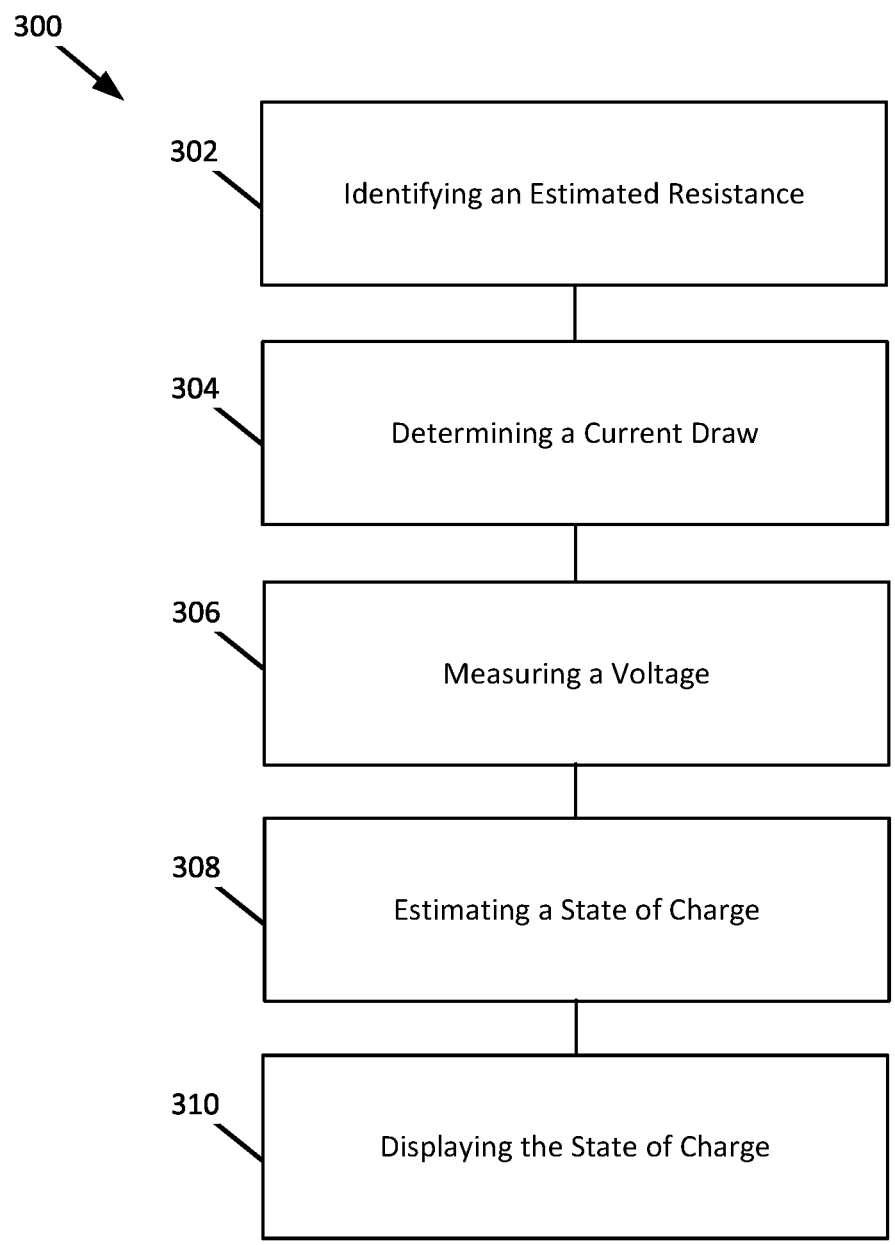
FIG. 3 is a flow chart of an example of a method for estimating a state of charge of a power source, consistent with embodiments of the present disclosure.

FIG. 3 shows a flow chart of a method 300 for estimating a state of charge of one or more batteries (e.g., the power source 108) of a surface treatment apparatus (e.g., the surface treatment apparatus 100). The method 300 may be embodied as one or more instructions stored in one or more memories (e.g., the one or more memories 204 of FIG. 2), wherein the one or more instructions are configured to be executed on one or more processors (e.g., the one or more processors 202 of FIG. 2). For example, the controller 200 may be configured to cause one or more steps of the method 300 to be carried out. Additionally, or alternatively, one or more steps of the method 300 may be carried out in any combination of software, firmware, or circuitry (e.g., an application-specific integrated circuit).

The method 300 may include a step 302. The step 302 includes identifying an estimated resistance between the apparatus controller 124 and the agitator motor 112 and the power source 108. The estimated resistance may be a fixed value that is stored in the apparatus controller 124 (e.g., during manufacture). Identifying the estimated resistance may include, for example, referencing the stored value (e.g., in a look-up table) and/or associating the estimated resistance with a constant (e.g., in an equation). The estimated resistance is based, at least in part, on the properties of conductors (e.g., material, length, gauge, and/or any other property) electrically coupling the apparatus controller 124 to the agitator motor 112 and the power source 108. The estimated resistance may not account for secondary effects on resistance (e.g., as a result of changes in temperature).

The method 300 may include a step 304. The step 304 includes determining a current draw of the agitator motor 112. For example, the one or more motor sensors 128 may be configured to measure a current draw of the agitator motor 112. An estimated voltage drop may be determined based, at least in part, on the measured current draw of the agitator motor 112. For example, an estimated voltage drop over the conductors electrically coupling the apparatus controller 124 to the agitator motor 112 and the power source 108 may be determined based, at least in part, on the measured current draw of the agitator motor 112 and the estimated resistance.

The method 300 may include a step 306. The step 306 may include measuring a voltage at the apparatus controller 124 using the apparatus controller 124. When the voltage is measured at the apparatus controller 124, the measured voltage incorporates the voltage drop caused by the resistance of the conductors electrically coupling the apparatus controller 124 to the agitator motor 112 and the power source 108. As such, the estimated voltage drop over the conductors may be added to the measured voltage such that an estimated power source voltage (e.g., battery voltage) can be determined. The estimated battery voltage may generally be described as corresponding an estimation of the voltage of the battery.

The method 300 may include a step 308. The step 308 includes estimating a state of charge for the one or more batteries 120. The state of charge may be estimated by comparing the estimated battery voltage to a discharge curve or table. For example, the estimated battery voltage may be compared to a table to determine an estimated state of charge. The discharge curve or table may incorporate the effects of other power consuming components on the rate of discharge. For example, a discharge table may account for the discharge caused by operation of the suction motor 118. For a vacuum cleaner having multiple operational modes (e.g., different suction motor speeds, agitator speeds, and/or any other mode) there may be a plurality of discharge curves or tables, wherein each curve or table corresponds to a respective mode. Use of multiple curves or tables may allow for different power consumption rates to be accounted for. As such, the curve or table referenced may be selected based, at least in part, on the current mode of the vacuum cleaner. Alternatively, the vacuum cleaner may use a single discharge curve or table that approximates the power consumption rates of each mode (e.g., an average of the discharge rates of each mode).

The method 300 may include a step 310. The step 310 may include causing a visual representation corresponding to the estimated state of charge to be displayed to a user (e.g., on the user interface 126).

Figure 4:
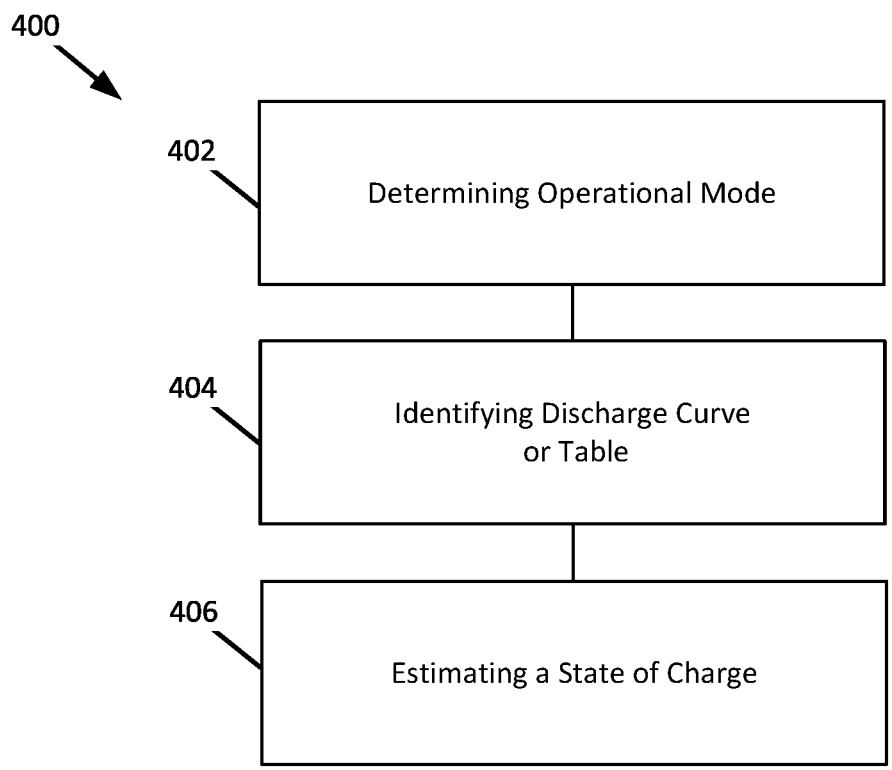
FIG. 4 is a flow chart of an example of a method for determining a discharge curve or a discharge table that is associated with a respective operational mode in order to determine a state of charge of a power source, consistent with embodiments of the present disclosure.

FIG. 4 shows a flow chart of a method 400 for determining a discharge curve or a discharge table that is associated with a respective operational mode in order to determine a state of charge of the power source 108, which may be an example of the step 308 of the method 300 of FIG. 3. The method 400 may be embodied as one or more instructions stored in one or more memories (e.g., the one or more memories 204 of FIG. 2), wherein the one or more instructions are configured to be executed on one or more processors (e.g., the one or more processors 202 of FIG. 2). For example, the controller 200 may be configured to cause one or more steps of the method 400 to be carried out. Additionally, or alternatively, one or more steps of the method 400 may be carried out in any combination of software, firmware, or circuitry (e.g., an application-specific integrated circuit).

The method 400 may include a step 402. The step 402 may include determining an operational mode (e.g., a hard floor mode, a carpet mode, an energy saver mode, a boost mode, or any other mode) of the surface cleaning apparatus 100. Each operational mode may cause, for example, one or more of the agitator motor 112 and/or the suction motor 118 to operate according to different rotational speeds (e.g., resulting in different current draws). For example, the user interface 126 may be configured to receive one or more inputs from a user regarding a desired operational mode and the apparatus controller 124 may be configured to cause the surface treatment apparatus 100 to operate (e.g., one or more of the motors 112 and 118) according to the operational mode.

The method 400 may include a step 404. The step 404 may include identifying a discharge curve or table associated with the operational mode.

The method may include a step 406. The step 406 may include estimating a state of charge for the one or more batteries 120 based, at least in part, on the identified discharge curve.

An example of a surface treatment apparatus, consistent with the present disclosure, may include a power source having one or more batteries and a battery controller and an apparatus controller communicatively coupled to the battery controller through a wireless connection.

In some instances, the wireless connection may be established using at least one infrared receiver and at least one infrared transmitter. In some instances, the wireless connection may be bidirectional. In some instances, the battery controller may be configured to communicate a state of charge of the one or more batteries to the apparatus controller. In some instances, the surface treatment apparatus may further include a user interface, the user interface being configured to display a visual representation corresponding to the state of charge.

Another example of a surface treatment apparatus, consistent with the present disclosure, may include a power source having one or more batteries and an apparatus controller configured to estimate a state of charge of the one or more batteries based, at least in part, on an operational mode of the surface treatment apparatus.

In some instances, determining the state of charge may include determining a discharge curve or a discharge table associated with the operational mode. In some instances, the surface treatment apparatus may further include a user interface, the user interface being configured to display a visual representation corresponding to the state of charge. In some instances, the surface treatment apparatus may further include a current sensor configured to measure a current draw of an agitator motor of the surface treatment apparatus. In some instances, an estimated voltage drop may be determined based, at least in part, on the current draw of the agitator motor. In some instances, the apparatus controller may be configured to measure a voltage at the apparatus controller. In some instances, the estimated voltage drop may be added to the voltage measured at the apparatus controller to obtain an estimated power source voltage. In some instances, the estimated power source voltage may be compared to a discharge curve or a discharge table associated with the operational mode.

Another example of a surface treatment apparatus, consistent with the present disclosure, may include a surface cleaning head having an agitator and an agitator motor configured to cause the agitator to rotate, a cleaning assembly including a suction motor and a dust cup, the suction motor fluidly coupled to the dust cup and the surface cleaning head, a power source electrically coupled to the suction motor and the agitator motor, the power source having one or more batteries, and an apparatus controller configured to estimate a state of charge of the one or more batteries based, at least in part, on a current draw of the agitator motor.

In some instances, the surface treatment apparatus may further include a user interface, the user interface being configured to display a visual representation corresponding to the state of charge. In some instances, an estimated voltage drop may be determined based, at least in part, on the current draw of the agitator motor. In some instances, the apparatus controller may be configured to measure a voltage at the apparatus controller. In some instances, the estimated voltage drop may be added to the voltage measured at the apparatus controller to obtain an estimated power source voltage. In some instances, the estimated power source voltage may be compared to a discharge curve or a discharge table. In some instances, the surface treatment apparatus may further include a current sensor configured to measure the current draw corresponding to the agitator motor.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A surface treatment apparatus comprising:
    a surface cleaning head having an agitator and an agitator motor configured to cause the agitator to rotate;
    an upright section movably coupled to the surface cleaning head;
    a cleaning assembly including a dust cup and a suction motor;
    a power source electrically coupled to the suction motor and the agitator motor, the power source having one or more batteries and a battery controller; and
    an apparatus controller communicatively coupled to the battery controller through a wireless connection, the wireless connection being established via:

apparatus communication circuitry coupled to the upright section, the apparatus communication circuitry including an apparatus transmitter and an apparatus receiver; and power source communication circuitry coupled to the power source, the power source communication circuitry including a power source transmitter configured to optically couple with the apparatus receiver and a power source receiver configured to optically couple with the apparatus transmitter.

2. The surface treatment apparatus of claim 1, wherein the apparatus transmitter and the power source transmitter are configured to generate an infrared signal.

3. The surface treatment apparatus of claim 2, wherein the wireless connection is bidirectional.

4. The surface treatment apparatus of claim 1, wherein the battery controller is configured to communicate a state of charge of the one or more batteries to the apparatus controller.

5. The surface treatment apparatus of claim 4 further comprising a user interface, the user interface having at least one of a light emitting diode or a liquid crystal display, the user interface being configured to display a visual representation corresponding to the state of charge using at least one of the light emitting diode or the liquid crystal display.

6. A surface treatment apparatus comprising:
a surface cleaning head having an agitator and an agitator motor configured to cause the agitator to rotate;
an upright section movably coupled to the surface cleaning head;
a cleaning assembly including a dust cup and a suction motor;
a power source having one or more batteries, the power source being electrically coupled to the agitator motor and the suction motor; and
an apparatus controller configured to estimate a state of charge of the one or more batteries based, at least in part, on a discharge curve or table associated with an operational mode of the surface treatment apparatus, wherein the apparatus controller is configured to:
measure a voltage at the apparatus controller;
add a voltage drop to the voltage to obtain an estimated power source voltage; and
compare the estimated power source voltage to the discharge curve or table associated with the operational mode of the surface treatment apparatus to obtain the estimated state of charge of the one or more batteries.

7. The surface treatment apparatus of claim 6 further comprising a user interface, the user interface being configured to display a visual representation corresponding to the estimated state of charge.

8. The surface treatment apparatus of claim 6, wherein the estimated voltage drop is determined based, at least in part, on the current draw of the agitator motor.

9. A surface treatment apparatus comprising:
a surface cleaning head having an agitator and an agitator motor configured to cause the agitator to rotate;
a cleaning assembly including a suction motor and a dust cup, the suction motor fluidly coupled to the dust cup and the surface cleaning head, the agitator motor and the suction motor selectively operable in a first operational mode or a second operational mode, wherein a rotational speed of at least one of the agitator motor or the suction motor is different between the first and second operational modes;
a power source electrically coupled to the suction motor and the agitator motor, the power source having one or more batteries; and
an apparatus controller configured to estimate a state of charge of the one or more batteries, wherein the apparatus controller is configured to:
determine whether the agitator motor and the suction motor are operating according to the first operational mode or the second operational mode;
measure a voltage at the apparatus controller;
add a voltage drop to the voltage to obtain an estimated power source voltage;
when the agitator motor and the suction motor are operating according to the first operational mode, compare the estimated power source voltage to a first discharge curve or table to obtain the estimated state of charge of the one or more batteries; and
when the agitator motor and the suction motor are operating according to the second operational mode, compare the estimated power source voltage to a second discharge curve or table to obtain the estimated state of charge of the one or more batteries.

10. The surface treatment apparatus of claim 9 further comprising a user interface, the user interface being configured to display a visual representation corresponding to the estimated state of charge.

11. The surface treatment apparatus of claim 10, wherein the voltage drop is determined based, at least in part, on the current draw of the agitator motor.

12. The surface treatment apparatus of claim 9 further comprising a current sensor configured to measure the current draw corresponding to the agitator motor.

\* \* \* \* \*